United States Patent [19]
Yamazaki

[11] Patent Number: 5,406,178
[45] Date of Patent: Apr. 11, 1995

[54] PULSE BEAM FORMING METHOD AND APPARATUS

[75] Inventor: Yuichiro Yamazaki, Tokyo, Japan

[73] Assignee: Kabushiki Kaisha Toshiba, Kawasaki, Japan

[21] Appl. No.: 61,003

[22] Filed: May 14, 1993

[30] Foreign Application Priority Data

May 18, 1992 [JP] Japan .................................. 4-124866

[51] Int. Cl.⁶ ............................................ H01J 29/58
[52] U.S. Cl. .................................. 315/382; 250/492.2
[58] Field of Search .................... 315/382; 250/396 R, 250/492.3, 396 ML, 398; 313/453; 219/121.12, 121.26, 121.27

[56] References Cited

U.S. PATENT DOCUMENTS

| | | | |
|---|---|---|---|
| 4,075,488 | 2/1978 | Okayama et al. | 250/396 R |
| 4,243,866 | 1/1981 | Pfeiffer et al. | 219/121 EK |
| 4,393,308 | 7/1983 | Anger et al. | 250/396 R |
| 5,180,919 | 1/1993 | Oae et al. | 250/492.2 |

*Primary Examiner*—Theodore M. Blum
*Attorney, Agent, or Firm*—Foley & Lardner

[57] ABSTRACT

In a pulse beam forming apparatus, there are disposed in order a beam generating device for generating a charged particle beam having a circular cross section, a beam elongating device for elongating the charged particle beam in cross section, a deflecting device for deflecting the charged particle beam in a direction perpendicular to the longitudinal direction of the cross section, an aperture for cutting the charged particle beam, and a beam reshaping device for reshaping the charged particle beam into one having a circular cross section.

13 Claims, 2 Drawing Sheets

PULSE BEAM FORMING METHOD AND APPARATUS

BACKGROUND OF THE INVENTION

1. Field of the Invention

The present invention relates to a pulse beam forming method and a pulse beam forming apparatus using a charged particle beam such as an electron beam and an ion beam.

2. Description of the Related Art

A pulse beam with a pulse width of picosecond order is mainly used in an EB (electron beam) tester. A beam deflecting method is employed as a pulse beam forming method, in which an electron beam is deflected by using a transverse electric field and is cut by means of an aperture. This method has advantages such as the apparatus employing the method can be easily mounted on a scanning electron microscope (SEM) and that a pulse width of nanosecond to picosecond order can be readily obtained.

FIG. 3 shows a known pulse beam forming apparatus for an EB tester and a ray diagram thereof. As shown in FIG. 3, an electron gun comprises a cathode 101, a Wehnelt cathode 102, and an anode 103, which emits an electron beam 110 having a substantially circulars cross section in an accelerated state. The electron beam 110 radially emitted is converged through a condenser lens 106 and an objective lens 107 to form an image of the cathode on a sample surface 109. There is an objective aperture (chopping aperture) 108, having a circular opening and disposed between the condenser lens 106 and the objective lens 107, to define an opening angle of the beam. A deflector 104 is located between the condenser lens 106 and the electron gun. When a sinusoidal wave or pulse is input from a power source 105 into the deflector 104, the electron beam 110 is deflected by the deflector 104. The objective aperture 108 periodically cuts the electron beam 110 to form a pulse beam.

FIG. 4 schematically shows a relation among the chopping aperture, the deflector, and the electron beam. An electron beam 210 is deflected by a parallel-plate type deflector 201, and is cut by a chopping aperture 202 (a conjugate image of objective aperture). A pulse width $\tau$ of the thus-obtained pulse beam may be expressed in a simple form by the following equation:

$$\tau = 2 \times S \times V \times (d+D)/k \times h \times L \quad (1),$$

where D is the opening inner diameter of the chopping aperture 202 and d is the beam diameter on the aperture 202.

In the equation (1), S is the distance between electrodes of the deflector, h is the length of the electrodes of the deflector, V is the acceleration voltage of the electron beam, L is the distance from the deflector to the chopping aperture, and k is the velocity of change of the deflection voltage. As seen from the equation (1), the pulse width $\tau$ is proportional to the sum $(d+D)$, which is a sum of the opening inner diameter D of the chopping aperture and the beam diameter d on the aperture.

As seen from the equation (1), it is necessary to make the sum $(d+D)$ smaller in order to form a pulse beam of shorter pulse width. The opening inner diameter D of the aperture determines the performance of the objective lens 103 (FIG. 3) and is determined by electron optic conditions. On the other hand, the beam diameter d on the aperture cannot be made smaller than the aperture opening. If the sum $(d+D)$ should be made smaller, the beam current of the electron beam passing through the aperture 202 would decrease. Particularly, when an electric field emission type electron gun is employed as the electron gun, the reduction rate of the optical system will decrease. Therefore, the opening inner diameter D of the chopping aperture must be kept relatively large in order to obtain a certain beam current.

As described, the sum $(d+D)$, which is a sum of the opening inner diameter D of the aperture 202 and the beam diameter d on the aperture 202, must be made smaller in order to obtain a pulse beam of shorter pulse width. However, if the sum $(d+D)$ is to be made smaller, the beam current of the electron beam decreases so as to lower the transmittance of the electron beam.

SUMMARY OF THE INVENTION

The present invention has been achieved, taking into account the above described problems. It is an object of the present invention to provide a pulse beam forming method and a pulse beam forming apparatus, which can obtain a pulse beam of shorter pulse width while maintaining the transmittance of the electron beam at a certain level.

The present invention involves a method for forming a pulse beam, comprising: deflecting a charged particle beam having an elongate cross section at a predetermined period in a direction perpendicular to the longitudinal direction of said cross section; cutting the charged particle beam by means of an aperture having an opening of a shape corresponding to said elongate cross section of the charged particle beam; reshaping the charged particle beam having passed through said aperture so as to be substantially circular in cross section; and focusing the charged particle beam having the substantially circular cross section on a sample, thereby irradiating said sample; and as well an apparatus for forming a pulse beam, comprising: deflecting means for deflecting a charged particle beam having an elongate cross section at a predetermined period in the direction perpendicular to a longitudinal direction of said cross section; an aperture disposed on a downstream side with respect to said deflecting means and having an opening of a shape corresponding to said elongate cross section of the charged particle beam, and for cutting the charged particle beam; reshaping means disposed on a downstream side with respect to said aperture, and for reshaping the charged particle beam having passed through said aperture as to be substantially circular in cross section; and foucsing means for focusing the charged particle beam having the substantially circular cross section on a sample, thereby irradiating said sample.

According to the present invention, the charged particle beam has an elongate cross section at the aperture, and the opening shape of the aperture corresponds to the shape of cross section of the charged particle beam, whereby the longitudinal component of the charged particle beam at the aperture can pass through the opening.

DESCRIPTION OF THE PREFERRED EMBODIMENTS

The preferred embodiments according to the present invention will be described with reference to FIGS. 1 and 2. FIG. 1 is a schematic diagram showing one embodiment according to the present invention.

Figure 1A:
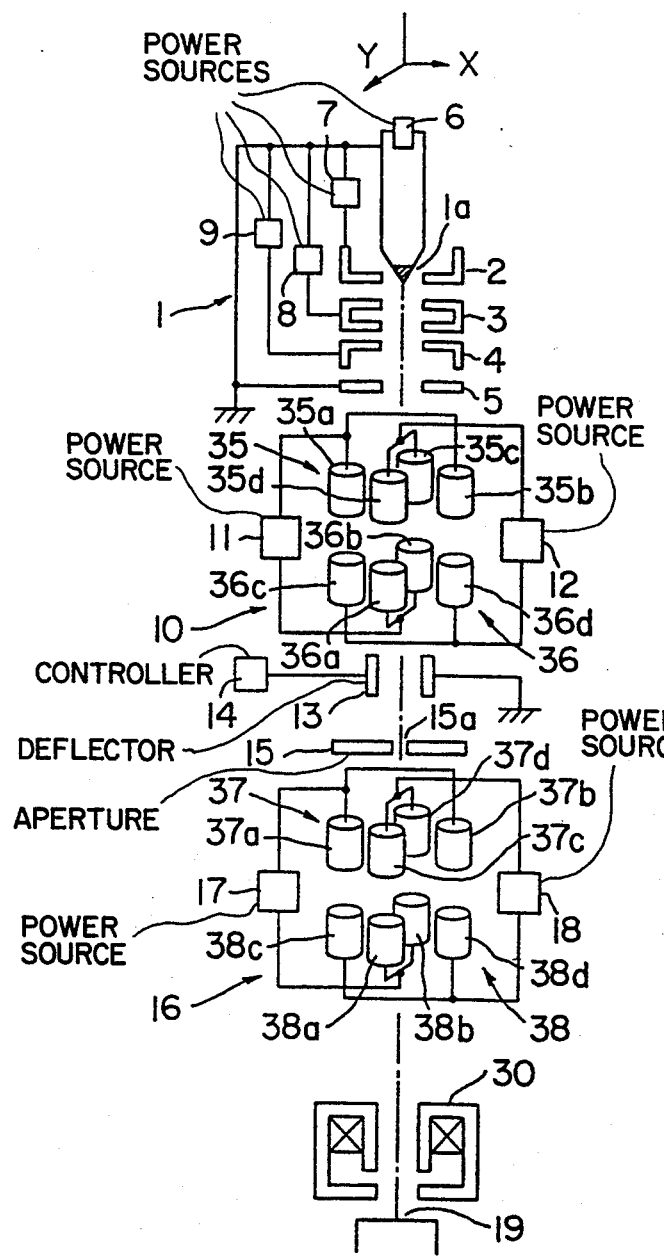
FIGS. 1(*a*), 1(*b*), and 1(*c*) are diagrams for describing an embodiment of a pulse forming method and a pulse forming apparatus according to the present invention.
Figure 2:
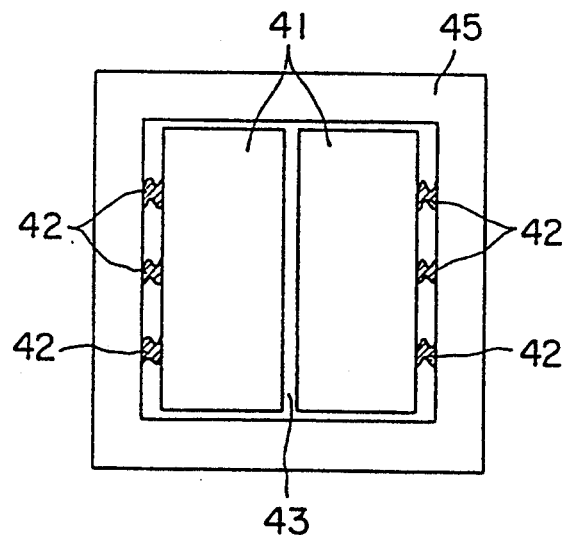
FIG. 2 is a view showing another example of an aperture.
Figure 3:
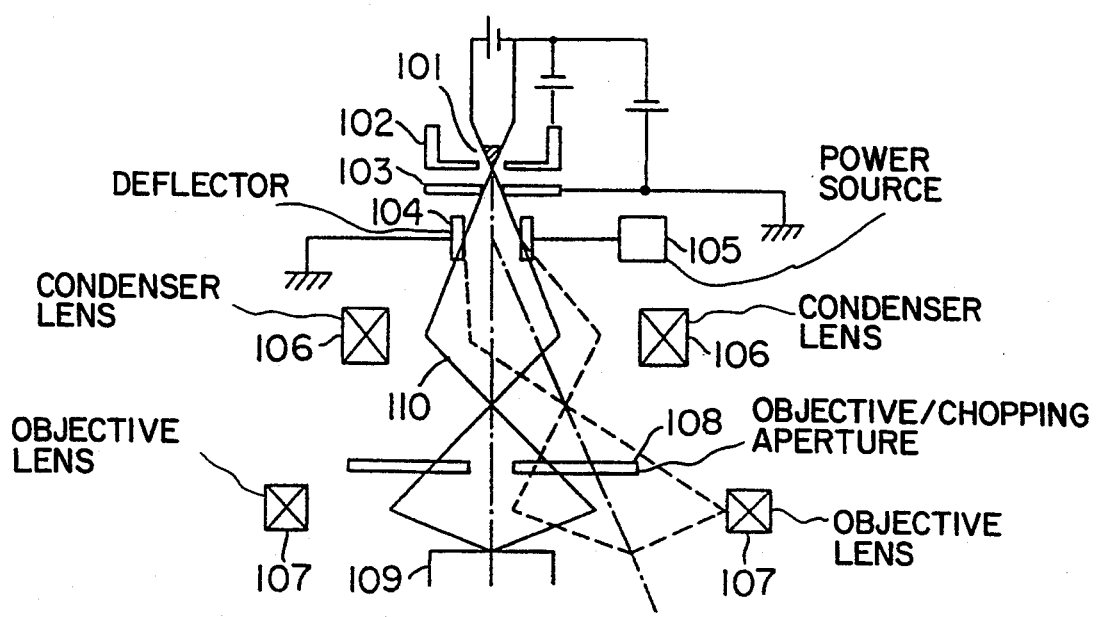
FIG. 3 is a schematic diagram showing a conventional pulse forming apparatus.
Figure 4:
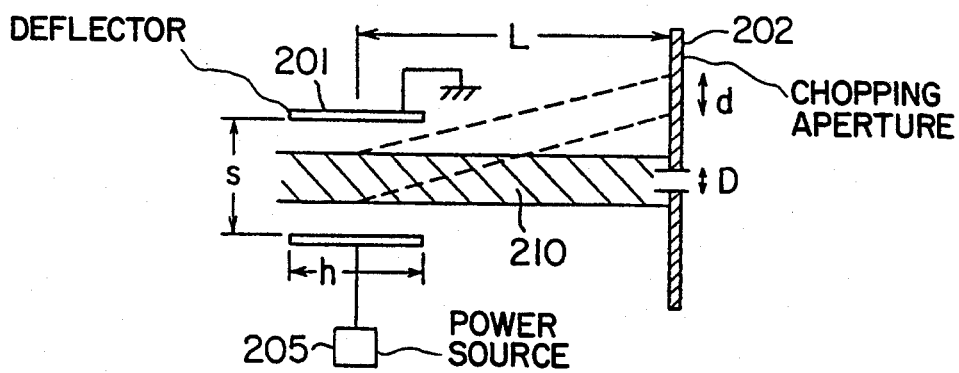
FIG. 4 is a sectional view showing deflecting means and an aperture in a conventional pulse forming apparatus.

In FIG. 1(a), the pulse beam forming apparatus is provided with a beam generating device 1 for generating an electron beam 40 of substantially circular cross section, beam elongating means 10 for shaping the electron beam 40 into one having an elongate cross section, a parallel-plate deflector 13 for deflecting the electron beam 40 in a direction perpendicular to the longitudinal direction of the elongate cross section, an aperture 15 for cutting the electron beam 40, and beam reshaping means 16 for reshaping the electron beam 40 of elongate cross section into one having a substantially circular cross section, in the named order from the upstream side.

The respective constituent members are as follows. The beam generating device 1 comprises a field emission type cathode 1a using a ZrO/W emitter, a suppressor electrode 2 to which a negative potential against the field emission type cathode 1a is applied, a drawing electrode 3, a focus adjusting lens electrode 4, and a ground anode 5, which are consecutively disposed in the named order. Voltage applying power sources 6, 7, 8, 9 are connected to the field emission type cathode 1a, to the suppressor electrode 2, to the drawing electrode 3, and to the focus adjusting lens electrode 4, respectively. Among them, the field emission type cathode 1a is heated by a current flow from the power source 6 and operates in the thermo-electric field emission mode.

The beam generating device 1 which is so constituted, generates an electron beam 40 having a substantially circular cross section.

The beam elongating means 10 consists of two quadrupole lenses 35, 36 in a two-layered arrangement, which elongates the cross section of the electron beam. Two electrodes 35a, 35b in the quadrupole lens 35 and two electrodes 36a, 36b in the quadrupole lens 36 are connected to the voltage applying power source 11. The other two electrodes 35c, 35d in the quadrupole lens 35 and the other two electrodes 36c, 36d in the quadrupole lens 36 are connected to the voltage applying power source 12. The voltage applying power source 11 applies $-V_1$ volts to the electrodes, while the voltage applying power source 12 applies $+V_1$ volts to the electrodes. The focus position of the quadrupole lenses 35, 36 is controlled by changing values of $\pm V_1$ volts. The parallel-plate deflector 13 is connected to a deflector controller 14. The deflector controller 14 applies a sinusoidal wave voltage or a pulse voltage to the deflector 13 to deflect the electron beam 40. The deflection direction of the electron beam 40 is a direction (x-direction) perpendicular to the longitudinal direction (y-direction) of the cross section of the electron beam 40.

Further, the aperture 15 has an opening 15a. The opening 15a has a rectangular shape corresponding to the elongate cross section of the electron beam 40.

The beam reshaping means 16 consists of two quadrupole lenses 37, 38 in a two-layered arrangement, which reshapes the elongate cross section of the electron beam 40 into a substantially circular cross section. Two electrodes 37a, 37b in the quadrupole lens 37 and two electrodes 38a, 38b in the quadrupole lens 38 are connected to the voltage applying power source 17. The other two electrodes 37c, 37d in the quadrupole lens 37 and the other two electrodes 38c, 38d in the quadrupole lens 38 are connected to the voltage applying power source 18. The voltage applying power source 17 applies $+V_2$ volts to the electrodes, while the voltage applying power source 18 applies $-V_2$ volts to the electrodes. Actual values of these $\pm V_2$ volts are so controlled that the electron beam 40 is focused at a crossover point 22. The electron beam 40 having passed through the crossover point 22 is focused by the objective lens 30 on the sample surface 19.

Figure 1B:
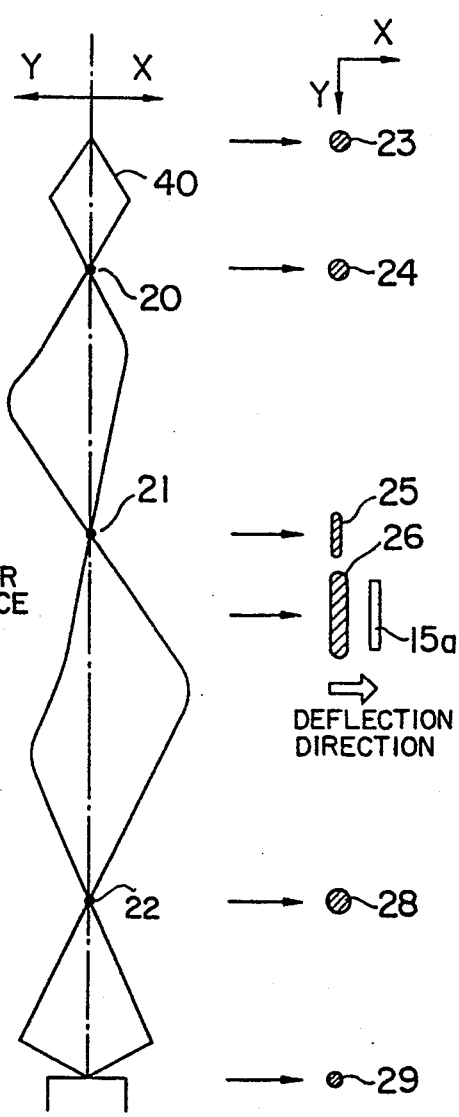
Figure 1C:

The following is a description of the operation in the present embodiment which is so constituted. FIG. 1(b) is a ray diagram in the pulse beam forming apparatus, and FIG. 1(c) shows cross sections of the electron beam. Since the optical system is not symmetric with respect to the optical axis, the ray diagram (FIG. 1(b)) separately shows the x-coordinate and the y-coordinate as arranged in parallel.

The electron beam 40 emitted from the field emission type cathode 1a of the beam generating device 1 passes through the suppressor electrode 2, through the drawing electrode 3, through the focus adjusting lens electrode 4, and through the anode 5 to form a crossover at a crossover point 20 below the anode 5. Since the beam generating device 1 is symmetric with respect to the axis thereof, the electron beam has respective circular cross sections 23, 24 at the field emission type anode 1a and at the crossover point 20.

The electron beam 40 is then shaped to have an elongate cross section by the two quadrupole lenses 35, 36 of the beam elongating means 10, to form a crossover at a crossover point 21 in the deflection center of the deflector 13. Therefore, the cross section of the electron beam 40 is elongate (elliptic) at the crossover point 21.

Then, the electron beam 40 reaches the aperture 15 and is enlarged into an elliptic cross section 26 similar to the cross section 25. The opening 15a of the aperture 15 is rectangular corresponding to the cross section 26 of the electron beam on the aperture 15, and the longitudinal direction of the opening 15a coincides with the longitudinal direction of the cross section 26 of the electron beam. Then, when the electron beam 40 is deflected by the deflector 13 at a predetermined period (100 Hz to 1.2 MHz) in the direction (x-direction) perpendicular to the longitudinal direction (y-direction) of the cross section, a pulse beam is generated while cutting the electron beam 40 by the aperture 15.

The electron beam 40 having passed through the opening 15a of the aperture 15 is then reshaped by the two quadrupole lenses 37, 38 of the beam reshaping means 16 to have a circular cross section. In detail, the electron beam forms a crossover at the crossover point 22 to have a circular cross section 28.

After that, the electron beam 40 passes through the objective lens 30 to be focused on the point of the sample 19.

As described, according to the present embodiment, the longitudinal (y-directional) component of the electron beam on the aperture 15 can be passed through the opening 15a, while the beam width (da in the equation (1)) of the electron beam in the deflection direction (x-direction) on the aperture 15 and the inner diameter (Da in the equation (1)) of the opening 15a of the aperture 15 can be made smaller. For this reason, the increase of the beam current and the reduction of pulse width can be achieved at the same time, as described with the equation (1).

The above embodiment shows an example in which the electrostatic quadrupole lenses 35, 36, 37, 38 are employed in the beam elongating means 10 and the beam reshaping means 16. These means do not always have to be composed of such lenses, but may be formed by multipole lenses each having more electrodes than four, or by magnetic field type multipole lenses. Also, the beam elongating means 10 and the beam reshaping means 16 respectively have the two-layered arrangement of the quadrupole lenses in the above embodiment, but they may be constructed by plural (more than two) layers of multipole lenses.

Although the present embodiment shows an example of use of the single-stage parallel-plate type deflector 13, any deflectors may be employed as long as they are of the transversal electric field type. Further, the deflector may be an ellipsoidal deflecting device comprised of a perpendicular-two-stage deflector.

The beam generating device 1 employs a thermoelectric field emission type electron gun in the above embodiment, but may use a field emission type electron gun. The effectiveness of the present invention is particularly great in an optical system employing the thermoelectric field emitting type electron gun or the field emission type electron gun because the opening inner diameter of the aperture must be made smaller because of the low reduction rate. Also the beam generating device 1 may employ a thermionic emission type electron gun of $LaB_6$, W, or the like.

The above embodiment shows an example in which the aperture 15 has a rectangular opening 15a. In another arrangement, the aperture may be so formed as to have a slit opening 43 between two plates 41 which are located in a frame 45, as shown in FIG. 2. The width of the opening 43 may be made variable by using piezoelectric devices 42 provided between the frame 45 and the plates 41. With such an arrangement, the width of the slit opening 43 can be arbitrarily changed in the beam deflection direction, whereby the pulse width of the pulse beam can be changed without changing the electron optic conditions. The conductance of a vacuum can be increased by enlarging the width of the opening 43.

In the above respective embodiments, the electron beam 40 is generated by the beam generating device 1 and the pulse beam is formed using the electron beam 40. Alternatively, another charged particle beam in place of the electron beam, for example an ion beam, may be generated to form a pulse beam therefrom.

As described above, according to the present invention, the longitudinal component of the charged particle beam on the aperture can pass through the opening of the aperture. Therefore, a pulse beam with narrowed pulse width can be obtained without lowering the beam current of the charged particle beam through the aperture.

What is claimed is:

1. A method for forming a pulse beam, comprising the steps of:
    deflecting a charged particle beam having an elongate cross section at a predetermined period in a direction perpendicular to the longitudinal direction of said cross section;
    cutting the charged particle beam by means of an aperture having an opening of a shape corresponding to said elongate cross section of the charged particle beam;
    reshaping the charged particle beam after having passed through said aperture by using at least two quadrupole lenses in a multi-layered arrangement with respect to one another so that the charged particle beam has a substantially circular cross section on a sample; and
    focusing the charged particle beam having the substantially circular cross section on a sample, thereby irradiating said sample.

2. A method for forming a pulse beam according to claim 1, wherein
    said charged particle beam having the elongate cross section is obtained by generating a charged particle beam having a substantially circular cross section and then elongating the cross section of the charged particle beam.

3. A method for forming a pulse beam according to claim 1, wherein
    said charged particle beam irradiating said sample is an electron beam.

4. A method for forming a pulse beam according to claim 1, wherein
    said charged particle beam irradiating said sample is an ion beam.

5. An apparatus for forming a pulse beam, comprising:
    deflecting means for deflecting a charged particle beam having an elongate cross section at a predetermined period in a direction perpendicular to the longitudinal direction of said cross section;
    an aperture, disposed on a downstream side with respect to said deflecting means and having an opening of a shape Corresponding to said elongate cross section of the charged particle beam, for cutting the charged particle beam;
    reshaping means, disposed on a downstream side with respect to said aperture, for reshaping the charged particle beam after having passed through said aperture so as to be substantially circular in cross section; and
    focusing means for focusing the charged particle beam having the substantially circular cross section on a sample, thereby irradiating said sample, and wherein
    the reshaping means includes at least two quadrupole lenses in a multi-layered arrangement with respect to one another.

6. An apparatus for forming a pulse beam according to claim 5, further comprising: a beam generating device for generating a charged particle beam having a substantially circular cross section and beam elongating means for elongating the substantially circular cross section of the charged particle beam, on an upstream side with respect to said deflecting means, in the named order.

7. An apparatus for forming a pulse beam according to claim 5, wherein said charged particle beam irradiating a sample is an electron beam.

8. An apparatus for forming a pulse beam according to claim 5, wherein
said charged particle beam irradiating a sample is an ion beam.

9. An apparatus for forming a pulse beam, comprising:
a beam generating device for generating a charged particle beam having a substantially circular cross section;
a beam elongating means for elongating the substantially circular cross section of the charged particle beam;
deflecting means for deflecting a charged particle beam having an elongate cross section at a predetermined period in a direction perpendicular to the longitudinal direction of said cross section;
an aperture, disposed on a downstream side with respect to said deflecting means and having an opening of a shape corresponding to said elongate cross section of the charged particle beam, for cutting the charged particle beam;
reshaping means, disposed on a downstream side with respect to said aperture, for reshaping the charged particle beam after having passed through said aperture so as to be substantially circular in cross section; and
focusing means for focusing the charged particle beam having the substantially circular cross section on a sample, thereby irradiating said sample, and wherein
the beam elongating means includes at least two quadrupole lenses in a multi-layered arrangement with respect to one another.

10. An apparatus for forming a pulse beam, comprising:
deflecting means for deflecting a charged particle beam having an elongate cross section at a predetermined period in a direction perpendicular to the longitudinal direction of said cross section;
an aperture disposed on a downstream side with respect to said deflecting means, having an opening of a shape corresponding to said elongate cross section of the charged particle beam, for cutting the charged particle beam;
reshaping means disposed on a downstream side with respect to said aperture, for reshaping the charged particle beam having passed through said aperture so as to be substantially circular in cross section; and
focusing means for focusing the charged particle beam having the substantially circular cross section on a sample, thereby irradiating said sample, and wherein
said aperture comprises a frame and a pair of plates disposed in said frame so as to form a slit opening therebetween, said pair of plates being supported through a piezo-electric device by the frame, whereby the shape of the slit opening is made variable.

11. An apparatus for forming a pulse beam according to claim 10, further comprising:
a beam generating device for generating a charged particle beam having a substantially circular cross section and beam elongating means, on an upstream side with respect to said deflecting means, for elongating the substantially circular cross section of the charged particle beam from the beam generation device.

12. An apparatus for forming a pulse beam according to claim 10, wherein
said charged particle beam irradiating the sample is an electron beam.

13. An apparatus for forming a pulse beam according to claim 10, wherein
said charged particle beam irradiating the sample is an ion beam.

* * * * *